United States Patent
Ren

(10) Patent No.: US 9,718,682 B2
(45) Date of Patent: Aug. 1, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Peng Ren, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/222,006

(22) Filed: Jul. 28, 2016

(65) Prior Publication Data

US 2017/0029272 A1 Feb. 2, 2017

(30) Foreign Application Priority Data

Jul. 31, 2015 (CN) .......................... 2015 1 0465602

(51) Int. Cl.
*H01L 21/00* (2006.01)
*B81C 1/00* (2006.01)
(Continued)

(52) U.S. Cl.
CPC ...... *B81C 1/00801* (2013.01); *H01L 21/6715* (2013.01); *H01L 21/67063* (2013.01); *H01L 21/687* (2013.01); *H01L 21/76861* (2013.01); *H01L 21/76873* (2013.01); *H01L 21/76898* (2013.01); *H01L 23/481* (2013.01);
(Continued)

(58) Field of Classification Search
CPC ........ B81C 1/00801; B81C 2201/0154; B81C 2201/05; B81C 2203/0778; H01L 23/481; H01L 21/76898; H01L 21/76873; H01L 21/76861; H01L 21/67063; H01L 21/6715; H01L 21/687; H01L 24/13; H01L 24/02; H01L 2224/02372; H01L 2224/02381; H01L 2224/02317; H01L 2224/13024

See application file for complete search history.

(56) References Cited

U.S. PATENT DOCUMENTS

2010/0123241 A1* 5/2010 Shi .................... H01L 21/76898
257/698
2011/0193225 A1* 8/2011 Chen ...................... H01L 24/82
257/737

(Continued)

*Primary Examiner* — Stephen W Smoot
*Assistant Examiner* — Vicki B Booker
(74) *Attorney, Agent, or Firm* — Anova Law Group, PLLC

(57) ABSTRACT

A method for fabricating a semiconductor structure includes providing a substrate with a first surface and a second surface, wherein at least one soldering pad is formed on the first surface of the substrate. The method also includes forming at least one via to expose each soldering pad by etching the substrate from the second surface, forming a seed layer to cover the second surface of the substrate and the sidewall and the bottom surfaces of each via, and then forming a redistribution metal layer over a portion of the seed layer formed on the sidewall and the bottom surfaces of each via and the second surface of the substrate surrounding each via. The method further includes alternately performing a pre-wetting process and a chemical etching process to completely remove the portion of the seed layer not covered by the redistribution metal layer.

17 Claims, 6 Drawing Sheets

(51) Int. Cl.
*H01L 23/48* (2006.01)
*H01L 21/768* (2006.01)
*H01L 21/67* (2006.01)
*H01L 21/687* (2006.01)
*H01L 23/00* (2006.01)

(52) U.S. Cl.
CPC .............. *H01L 24/02* (2013.01); *H01L 24/13* (2013.01); *B81C 2201/0154* (2013.01); *B81C 2201/05* (2013.01); *B81C 2203/0778* (2013.01); *H01L 2224/02317* (2013.01); *H01L 2224/02372* (2013.01); *H01L 2224/02381* (2013.01); *H01L 2224/13024* (2013.01)

(56) References Cited

U.S. PATENT DOCUMENTS

| | | | | |
|---|---|---|---|---|
| 2012/0258594 A1* | 10/2012 | Barth | ................ | H01L 21/76898 438/667 |
| 2014/0342547 A1* | 11/2014 | Lin | ................... | H01L 21/76898 438/614 |
| 2015/0364425 A1* | 12/2015 | Lee | ......................... | H01L 24/03 257/737 |
| 2016/0099201 A1* | 4/2016 | Choi | .................... | H01L 23/481 257/621 |

* cited by examiner

US 9,718,682 B2

SEMICONDUCTOR STRUCTURE AND FABRICATION METHOD THEREOF

CROSS-REFERENCES TO RELATED APPLICATIONS

This application claims the priority of Chinese Patent Application No. CN201510465602.9, filed on Jul. 31, 2015, the entire content of which is incorporated herein by reference.

FIELD OF THE DISCLOSURE

The present disclosure generally relates to the field of semiconductor device packaging technology and, more particularly, relates to a semiconductor structure and fabrication method thereof.

BACKGROUND

With continuous development of semiconductor technology, feature size of current semiconductor devices has become very small and how to further increase the number of semiconductor devices in two-dimensional packaging structures has also become increasingly difficult. Therefore, three-dimensional packaging has become a method to effectively improve the integration degree of chips.

Currently, three-dimensional packaging includes gold-wire-bonded die stacking, package stacking, and three-dimensional stacking based on through silicon via (TSV). Among them, the three-dimensional stacking technique using TSV has demonstrated the following three advantages: (1) the integration density may be high; (2) the length of electrical interconnections may be greatly reduced and, thus, problems such as signal delay frequently occurring in two-dimensional system-on-chip (SOC) may be solved; (3) the packaged chip may have multiple functions by integrating chips with different functionalities (such as RF, RAM, logic, MEMS, imaging transistor, etc.) using the TSV technique. Therefore, the three-dimensional package stacking technique based on TSV interconnections is becoming a more popular chip packaging technique.

However, the performance of semiconductor structures formed by the TSV technique may still need to be improved. The disclosed fabrication method and device structure in the present disclosure are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate with a first surface and a second surface opposite to the first surface. At least one soldering pad is formed on the first surface of the semiconductor substrate. The method also includes forming at least one via in the semiconductor substrate to expose each soldering pad by etching the semiconductor substrate from the second surface of the semiconductor substrate. The method further includes forming a seed layer to cover a sidewall surface and a bottom surface of each via and the second surface of the semiconductor substrate and then forming a redistribution metal layer to cover a portion of the seed layer formed on the sidewall and the bottom surfaces of each via and on a portion of the second surface of the semiconductor substrate surrounding each via. Finally, the method also includes alternately performing a pre-wetting process and a chemical etching process to completely remove the portion of the seed layer not covered by the redistribution metal layer, wherein a diluting agent is sprayed onto the seed layer and the redistribution metal layer during the pre-wetting process to let each via retain a portion of the diluting agent and an etch solution is sprayed onto the seed layer and the redistribution metal layer during the chemical etching process to remove a portion of the seed layer not covered by the redistribution metal layer.

Another aspect of the present disclosure provides a semiconductor structure. The semiconductor structure includes a semiconductor substrate with a first surface and a second surface opposite to the first surface. The semiconductor structure further includes at least one soldering pad formed on the first surface of the semiconductor substrate and at least one via formed in the semiconductor substrate by etching the substrate from the second surface to expose the surface of each soldering pad. The semiconductor structure also includes a seed layer covering a sidewall surface and a bottom surface of each via and a portion of the second surface of the semiconductor substrate surrounding each via. The semiconductor structure also includes a redistribution metal layer formed on the seed layer. The seed layer and the redistribution metal layer are formed by a process including forming a seed layer to cover the sidewall surface and the bottom surface of each via and the second surface of the semiconductor substrate, forming a redistribution metal layer to cover a portion of the seed layer formed on the sidewall and the bottom surfaces of each via and on a portion of the second surface of the semiconductor substrate surrounding each via; and alternately performing a pre-wetting process and a chemical etching process to completely remove the portion of the seed layer not covered by the redistribution metal layer, wherein a diluting agent is sprayed onto the seed layer and the redistribution metal layer during the pre-wetting process to let each via retain a portion of the diluting agent and an etch solution is sprayed onto the seed layer and the redistribution metal layer during the chemical etching process to remove a portion of the seed layer not covered by the redistribution metal layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-6 show schematic cross-section views of a semiconductor structure corresponding to certain stages of an existing fabrication method.

Figure 1:
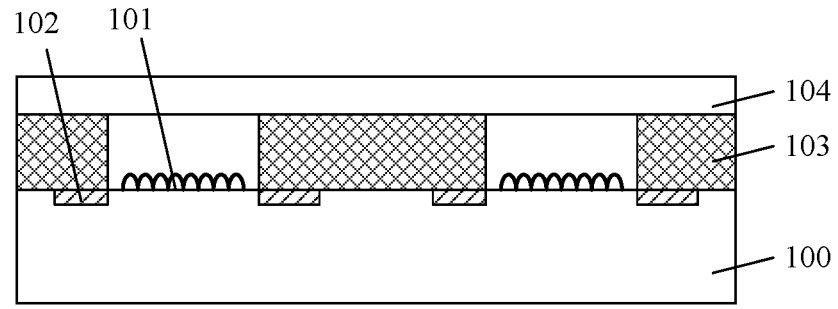
FIGS. 1-6 illustrate schematic cross-section views of a semiconductor structure corresponding to certain stages of an existing fabrication method.

Referring to FIG. 1, a semiconductor substrate 100 is provided. The semiconductor substrate 100 includes two opposite surfaces: a first surface and a second surface. The first surface of the semiconductor substrate 100 contains a plurality of photosensitive areas 101. A soldering pad 102 is formed on the first surface of the semiconductor substrate 100 surrounding each photosensitive area 101. An embankment structure 103 is formed on the first surface of the semiconductor substrate 100 to surround the photosensitive areas 101. A plurality of cavities are formed in the embankment structure 103 with each cavity exposing a corresponding photosensitive area 101. Further, a glass layer 104 is formed on the embankment structure 103 to cover the opening of each cavity.

Figure 2:
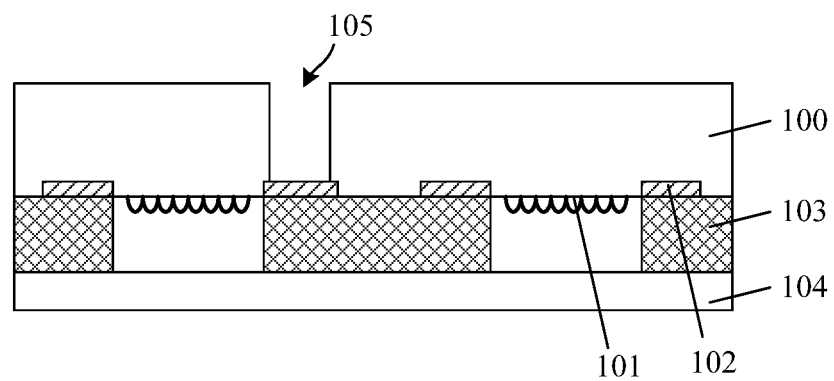

Referring to FIG. 2, a via 105 is formed in the semiconductor substrate 100 by etching through the semiconductor substrate 100 starting from the second surface until the surface of a soldering pad 102 is exposed.

Figure 3:
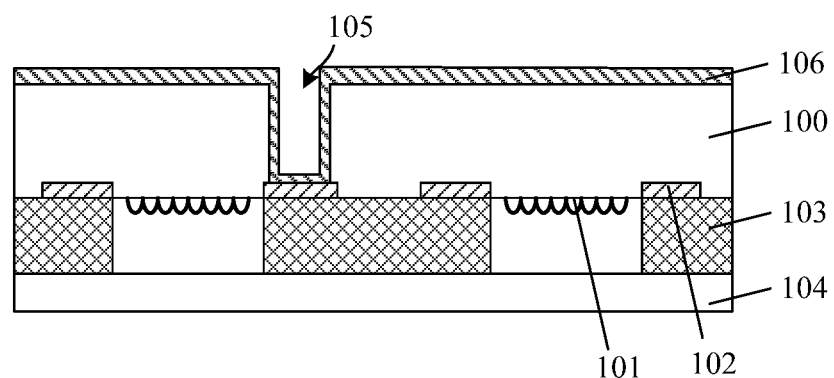

Referring to FIG. 3, a seed layer 106 is formed on the second surface of the semiconductor substrate 100 as well as the side surface and the bottom surface of the via 105.

Figure 4:
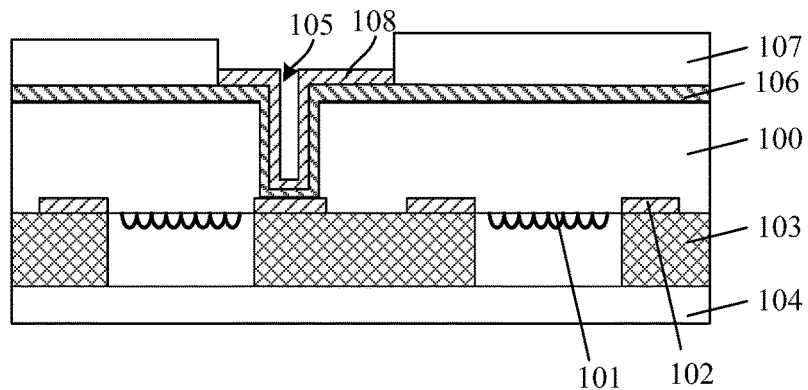

Referring to FIG. 4, a mask layer 107 is formed on the seed layer 106. An opening is formed in the mask layer 107 to expose the via 105 and a portion of the seed layer 106 formed on the second surface of the semiconductor substrate 100. A redistribution metal layer 108 is formed on the surface of the seed layer 106 in the opening through an electroplating process. During the electroplating process, the seed layer 106 serves as both a conductive layer and a seed layer.

Figure 5:
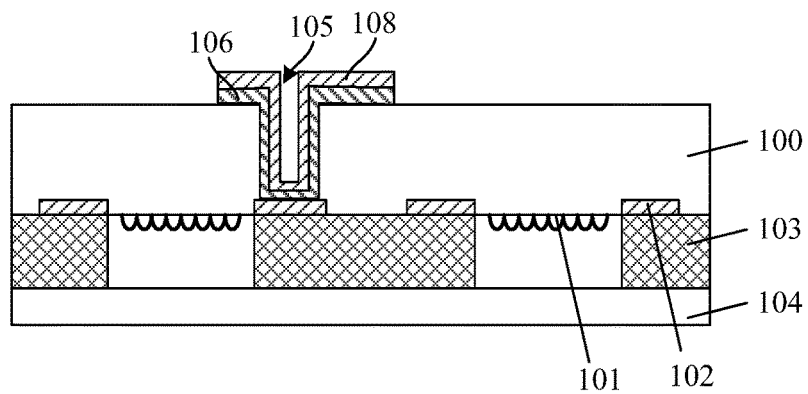

Referring to FIG. 5, the mask layer 107 (referring to FIG. 4) is removed. Then, a portion of the seed layer 106 formed on the second surface of the semiconductor substrate 100 on both sides of the redistribution metal layer 108 is removed by an etching process using the redistribution metal layer 108 as an etching mask.

Figure 6:
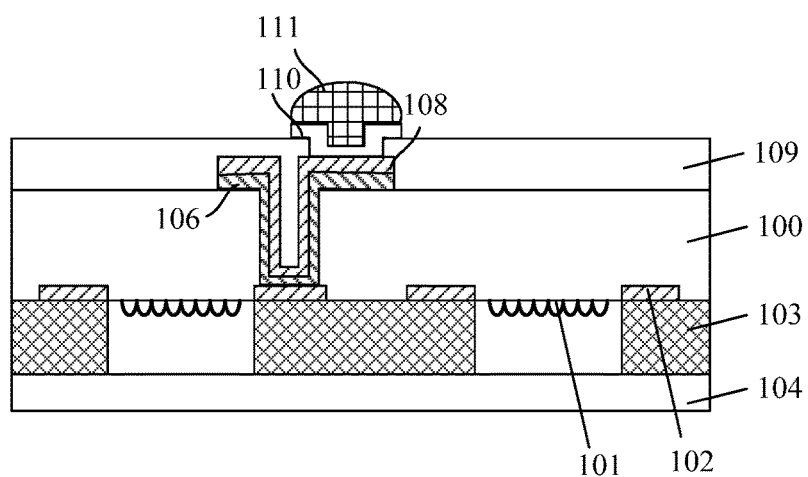

Referring to FIG. 6, an isolation layer 109 is formed to cover the redistribution metal layer 108 and the second surface of the semiconductor substrate 100. An opening is formed in the isolation layer 109 to expose a portion of the surface of the redistribution metal layer 108. Further, a bulging lower metal layer 110 is formed in the opening and also on the surface of the isolation layer 109. A soldering bump 111 is formed on the bulging lower metal layer 110. Finally, the portion of the bulging lower metal layer 110 formed on the isolation layer 109 on both sides of the soldering bump 111 is removed.

According to the fabrication process for the semiconductor structure described above, the seed layer 106 is formed by a sputtering process. However, referring to FIG. 3, the via 105 is relatively deep. Thus, when the seed layer 106 is formed by sputtering, the thickness of the seed layer 106 formed on the side surface and the bottom surface of the via is smaller than the thickness of the seed layer 106 formed on the second surface of the semiconductor substrate 100. That is, the seed layer 106 is not uniformly formed.

Further, referring to FIG. 4, an electroplating process is then performed to form the redistribution metal layer 108. During the formation of the redistribution metal layer 108, due to the space limitation of the via 105, the exchange efficiency of copper ions in the electroplating solution inside of the via 105 is lower than the exchange efficiency of copper ions in the electroplating solution on the second surface of the semiconductor substrate 100. Therefore, the thickness of the redistribution metal layer 108 formed in the via 105 is smaller than the thickness of the redistribution metal layer 108 formed on the second surface of the semiconductor substrate 100.

Subsequently, referring to FIG. 5, when the redistribution metal layer 108 is used as an etch mask during a wet etching process to remove the portion of the seed layer 106 formed on both sides of the redistribution metal layer 108, because the thickness of the redistribution metal layer 108 formed in the via 105 is smaller than the thickness of the redistribution metal layer 108 formed on the second surface of semiconductor substrate 100, the redistribution metal layer 108 formed in the via 105 is easily etched through by the etch solution, which further affects the conductive performance of the redistribution metal layer 108.

Figure 16:
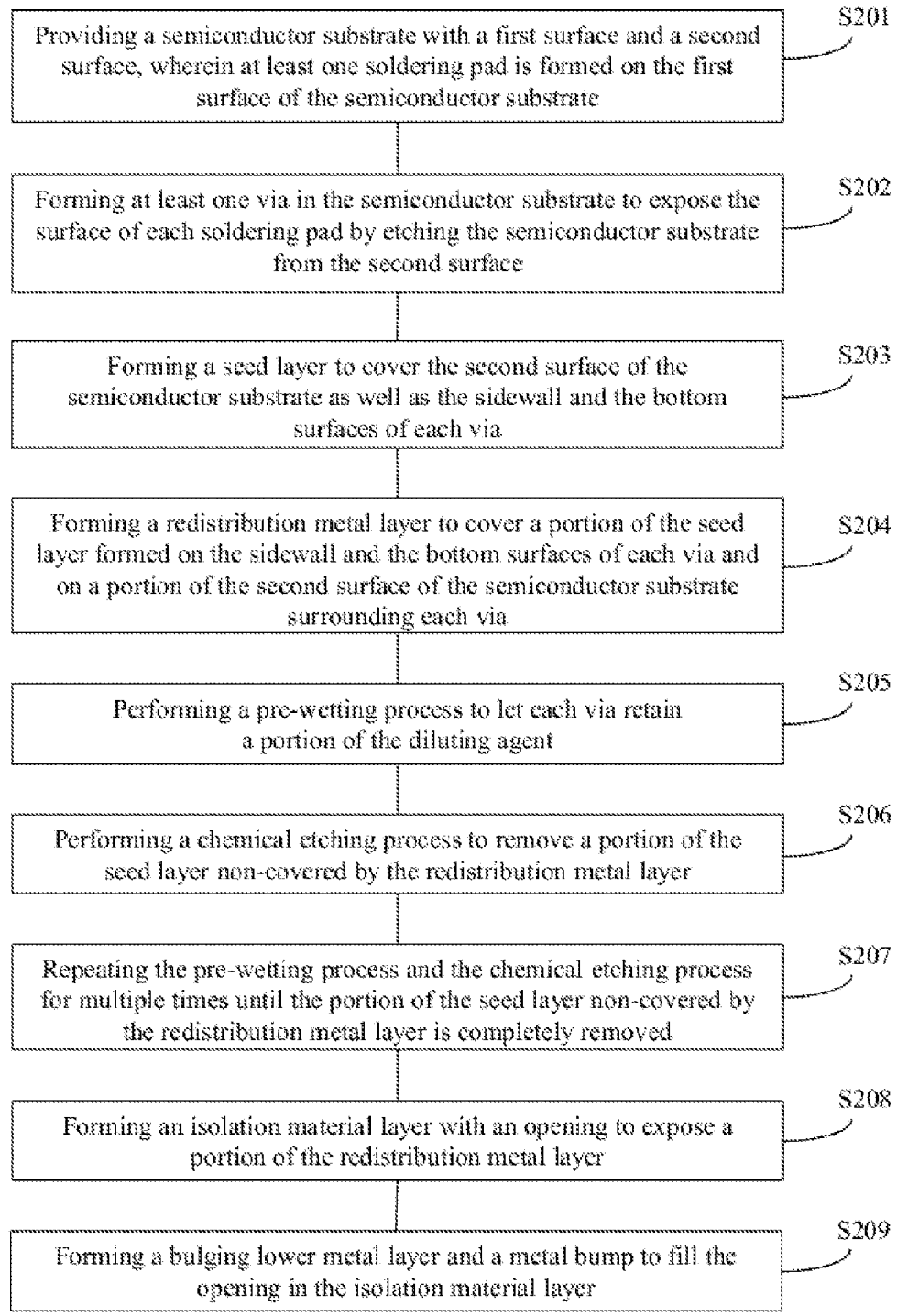
FIG. 16 illustrates a flowchart of the exemplary fabrication process for a semiconductor structure consistent with disclosed embodiments.

Accordingly, the present disclosure provides a method for fabricating a semiconductor structure to prevent the redistribution metal layer formed in the via from being etched through. FIG. 16 shows a flowchart of an exemplary fabrication process consistent with disclosed embodiments.

Figure 7:
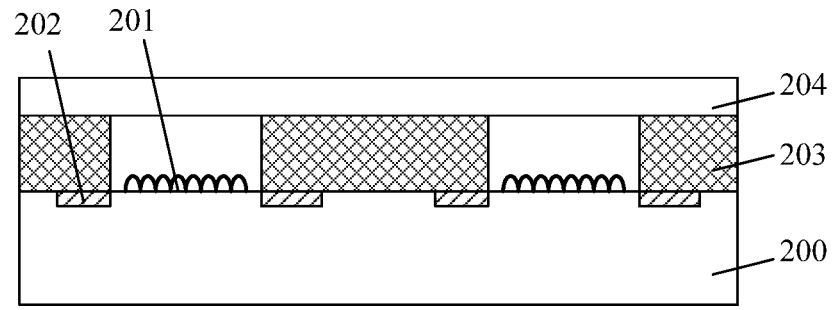
FIGS. 7-15 illustrate schematic views of a semiconductor structure corresponding to certain stages of an exemplary fabrication method consistent with disclosed embodiments.

Referring to FIG. 16, at the beginning of the fabrication process, a semiconductor substrate is provided (S201). FIG. 7 shows a schematic cross-section view of the corresponding semiconductor structure consistent with disclosed embodiments.

Referring to FIG. 7, a semiconductor substrate 200 is provided. The semiconductor substrate 200 includes two opposite surfaces: a first surface and a second surface. At least one soldering pad 202 may be formed on the first surface of the semiconductor substrate 200.

The semiconductor substrate 200 may be made of silicon, germanium, silicon on insulator (SOI), quartz, ceramic, or glass. In one embodiment, the semiconductor substrate 200 is made of silicon.

The first surface of the semiconductor substrate 200 may contain a plurality of photosensitive areas 201. The plurality of photosensitive areas 201 may be used to receive external light and convert the received external light into electrical signal. The electrical signal may then be transmitted to the soldering pad 202 through transistor circuit structures or metal interconnections formed on the semiconductor substrate 200.

The soldering pad 202 may be made of a conductive metal, alloy, or metal compound, including Cu, W, Al, Ni, Ag, tin-silver alloy, tin-lead alloy, metal silicide (such as NiSi), etc.

One or more soldering pads 202 may be formed on the first surface of the semiconductor substrate 200. That is, one or more soldering pads 202 may be formed on a same side of the semiconductor substrate 200 as the photosensitive areas 201. When the number of the soldering pads 202 is more than one (i.e., ≥2), the soldering pads 202 may be formed on one side or on both sides of the photosensitive area 201, or may be formed to surround the photosensitive area 201.

In certain other embodiments, a dielectric layer, an optical filter layer, and/or a microlens layer may also be formed on the first surface of the semiconductor substrate 200.

Additionally, microelectromechanical system (MEMS) transducers (such as MEMS acceleration transducers, acceleration transducers, etc.), integrated circuits, and/or other semiconductor devices (such as transistor, capacitor, resistor, etc.) may be formed on the first surface of the semiconductor substrate 200. The soldering pads 202 on the first surface of the semiconductor substrate 200 may be connected to the input-signal terminals or the output-signal terminals of the MEMS transducers, integrated circuits, or other semiconductor devices.

Further, a plurality of embankment structures 203 may be formed on the first surface of the semiconductor substrate 200 to surround the plurality of the photosensitive areas 201. That is, the embankment structures 203 may contain a plurality of cavities with each cavity exposing the corresponding photosensitive area 201. A glass board 204 may then be placed on the plurality of embankment structures 203 to seal the openings of the cavities formed in the plurality of embankment structures 203.

The embankment structure 203 may be made of organic polymer or any other appropriate material. The organic polymer may be epoxy resin, polyimide, benzocyclobutene, polybenzoxazole, etc.

In one embodiment, a glass board 204 may be provided and a plurality of embankment structures 203 may then be formed on one surface of the glass board 204. The embankment structures 203 may contain a plurality of cavities. The number of the cavities may correspond to the number of the photosensitive areas 201 on the first surface of the semiconductor substrate 200. The embankment structures 203 may be fabricated by a screen printing process or any other appropriate fabrication process. Finally, the embankment structures 203 formed on the glass board 204 may be pressed onto the first surface of the semiconductor substrate 200 with each cavity aligned to be right above the corresponding photosensitive area 201.

The glass board 204 and the plurality of embankment structures 203 may together seal up the photosensitive areas 201 to prevent the photosensitive areas 201 from being damaged during subsequent processes.

In certain other embodiments, when MEMS transducers (such as MEMS acceleration transducers, acceleration transducers, etc.), integrated circuits, or other semiconductor devices (such as transistor, capacitor, resistor, etc.) are formed on the first surface of the semiconductor substrate 200, a dielectric layer or an isolation layer may be formed on the first surface of the semiconductor substrate 200. Further, a glass board may then be placed on the dielectric layer or the isolation layer.

Figure 8:
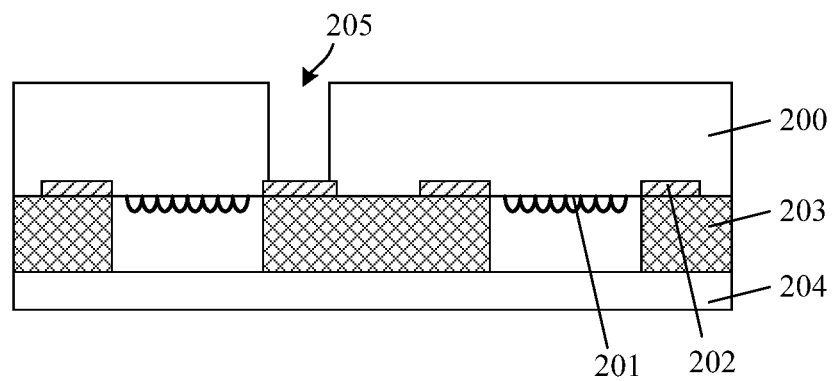

Returning to FIG. 16, a via exposing the surface of a soldering pad may be formed in the semiconductor substrate by etching the semiconductor substrate starting from the second surface of the semiconductor substrate (S202). FIG. 8 shows a schematic cross-section view of the corresponding semiconductor structure.

Referring to FIG. 8, a via 205 is formed by etching the semiconductor substrate 200 starting from the second surface of the semiconductor substrate 200. The via 205 may be formed through the semiconductor substrate 200 and may expose the surface of a soldering pad 202.

The semiconductor substrate 200 may be etched by a dry etching process, such as a plasma etching process or a Bosch etching process. In one embodiment, the semiconductor substrate 200 is etched by a Bosch etching process. The Bosch etching process may include alternately-performed an etching step and a deposition step. The etching step is adopted to form an etched hole by etching the semiconductor substrate. The etching gas used in the etching step may include $SF_6$. The deposition step may be adopted to form polymer on the sidewall of the etched hole. The gas used in the deposition step may include $C_4F_8$.

Figure 9:
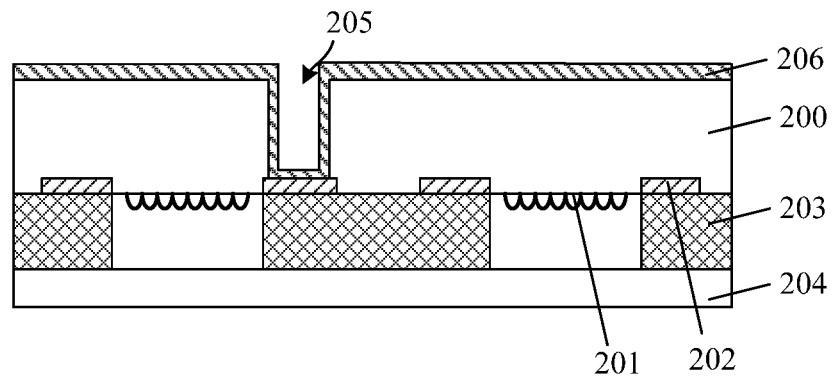

Further, returning to FIG. 16, a seed layer may be formed on the second surface of the semiconductor substrate as well as the sidewall surface and the bottom surface of the via (S203). FIG. 9 shows a schematic cross-section view of the corresponding semiconductor structure.

Referring to FIG. 9, a seed layer 206 may be formed to cover the second surface of the semiconductor substrate 200 as well as the sidewall surface and the bottom surface of the via 205. The seed layer 206 may be used as a seed layer during a subsequent electroplating process and may also serve as a conductive layer during the electroplating process.

The seed layer 206 may include a metal adhesion layer and a seed layer formed on the metal adhesion layer. The metal adhesion layer may be made of one or more of Ti, Ta, TiN, and TaN. The seed layer may be made of Cu. The metal adhesion layer and the seed layer may be formed by a sputtering process.

Returning to FIG. 16, a redistribution metal layer may be formed to cover a portion of the seed layer formed on the sidewall and the bottom surfaces of each via and on a portion of the second surface of the semiconductor substrate surrounding each via (S204).

Figure 10:
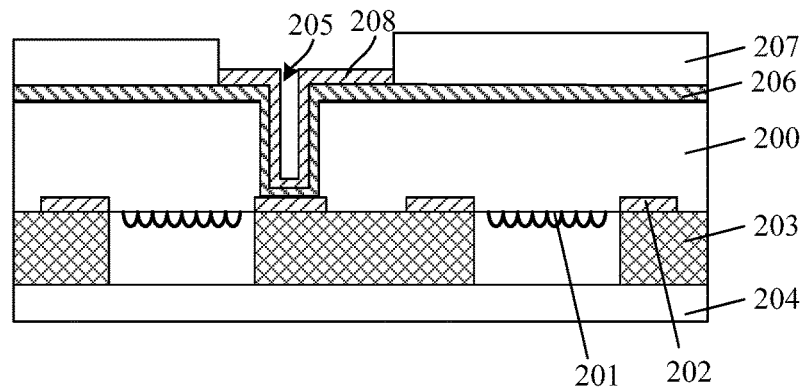
Figure 11:
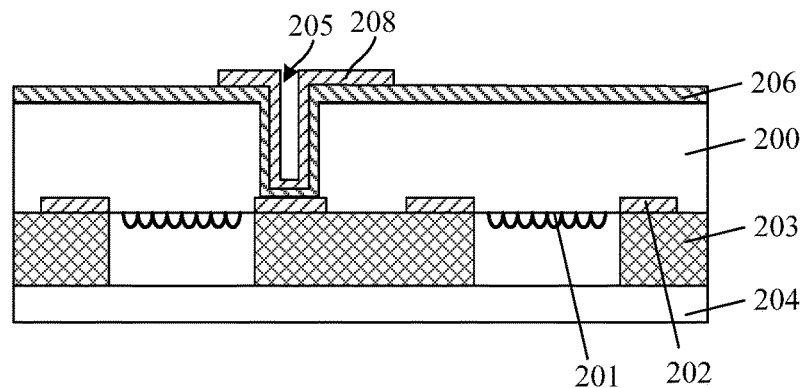

In one embodiment, the redistribution metal layer may be formed by a process including the following steps: 1) a mask layer with an opening exposing the via and a portion of the seed layer surrounding the via may be formed on the seed layer; 2) a redistribution metal layer may be formed in the opening; and 3) the mask layer may then be removed. FIG. 10 shows a schematic cross-section view of the corresponding semiconductor structure after the mask layer and the redistribution metal layer are formed. FIG. 11 shows a schematic cross-section view of the corresponding semiconductor structure after removing the mask layer.

Referring to FIG. 10, a mask layer 207 may be formed on the seed layer 206. An opening may then be formed in the mask layer 207 to expose the via 205 and a portion of the seed layer 206 formed on the second surface of the semiconductor substrate 200.

The mask layer 207 may be made of photoresist or any other appropriate material such as SiO, SiN, etc. In one embodiment, the mask layer 207 is made of photoresist. Specifically, a photoresist layer may be first formed on the seed layer 206 by a spin-coating process and, then, an opening may be formed in the photoresist layer through an exposure and development process to expose the via 205 and the portion of the seed layer 206 formed on the second surface of the semiconductor substrate 200 on both sides of the via.

Further, a redistribution metal layer 208 may be formed on the surface of the seed layer 206 exposed in the opening. The redistribution metal layer 208 may be formed by an electroplating process.

The redistribution metal layer 208 may be made of Cu. When an electroplating process is adopted to form the redistribution metal layer 208, due to the restriction of the morphology and the size of the via 205, the exchange efficiency of copper ions in the electroplating solution inside the via 205 may be lower than the exchange efficiency of copper ions in the electroplating solution outside of the via 205. Therefore, the thickness of the redistribution metal layer 208 formed in the via 205 may be smaller than the thickness of the redistribution metal layer 208 formed on the second surface of the semiconductor substrate 200. In certain other embodiments, the redistribution metal layer 208 may be made of any other metal material suitable for electroplating.

Further, referring to FIG. 11, the mask layer 207 (referring to FIG. 10) is removed. The mask layer 207 may be removed by an ashing process or any other appropriate wet etching or dry etching process.

Figure 12:
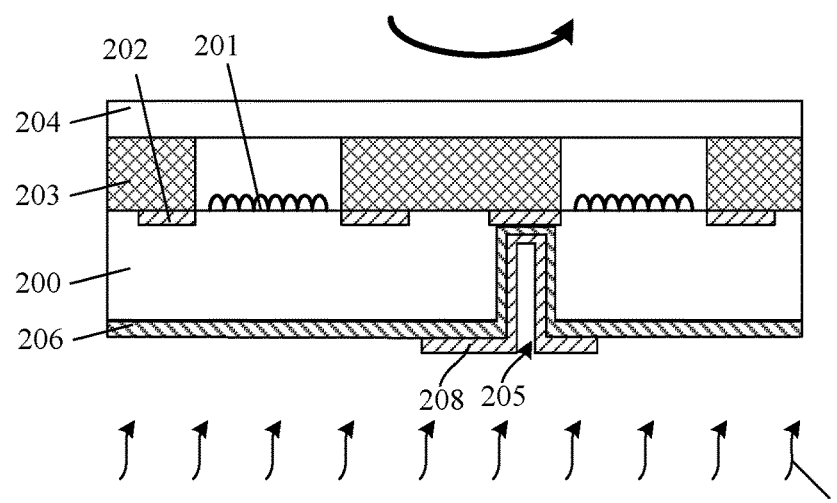

Further, returning to FIG. 16, a pre-wetting process may be performed to let the via retain some diluting agent (S205). FIG. 12 shows a schematic diagram of the pre-wetting process.

Referring to FIG. 12, a pre-wetting process 21 is performed. Specifically, a diluting agent may be sprayed onto the surface of the seed layer 206 and the surface of the redistribution metal layer 208. A portion of the sprayed diluting agent may then be retained in the via 205.

The diluting agent used in the process may be deionized water (DI-water) or an organic solvent that may not corrode the redistribution metal layer 208. The diluting agent may also be any other appropriate liquid, solution, or solvent that may not corrode the redistribution metal layer 208. In one embodiment, the diluting agent is DI-water.

Specifically, at the beginning of the pre-wetting process 21, the semiconductor substrate 200 may be placed into an etching apparatus. The glass board 204 is held by a clamping unit in the etching apparatus with the opening of the via 205 in the semiconductor substrate 200 facing downwards. The clamping unit may then be driven to let the semiconductor substrate 200 spin.

In the meantime, a diluting agent (DI-water) may be sprayed onto the surfaces of the seed layer 206 and the redistribution metal layer 208 from down to up. The diluting agent (DI-water) sprayed on the surface of the seed layer 206 formed on the second surface of the semiconductor substrate 200 may be spun-out under the effect of centrifugal force and gravity. Therefore, diluting agent (DI-water) residue on the second surface of the semiconductor substrate 200 may be avoided and, thus, a subsequently-performed chemical etching process may not be affected. Moreover, the portion of the diluting agent (DI-water) sprayed into the via 205 may be held in the via 205 because the sidewall of the via 205 may provide support to the diluting agent to cancel the effect of centrifugal force.

In one embodiment, the opening of the via 205 in the semiconductor substrate 200 may be kept facing downwards during the pre-wetting process 21 and also during the subsequently-performed chemical etching process lies in several aspects. First, during the pre-wetting process 21, the diluting agent (DI-water) sprayed on the surface of the seed layer 206 formed on the second surface of the semiconductor substrate 200 may be spun-out under the effect of centrifugal force and gravity. Therefore, no diluting agent residue may be left on the second surface of the semiconductor substrate 200.

Second, after the completion of the entire pre-wetting process 21 and the subsequent chemical etching process, the etch solution residue may easily flow out from the via 205 by reducing the spin speed of the semiconductor substrate 200, facilitating subsequent cleaning and also preventing trapping residue of the etch solution inside the via 205.

Further, the pre-wetting process 21 and the chemical etching process may be alternately performed for multiple times. Specifically, after each chemical etching process is completed, the etch solution may be flow out from the via 205 by reducing the spin speed of the semiconductor substrate 200. When a next pre-wetting process 21 is performed, fresh diluting agent (DI-water) may be refilled into the via 205 to ensure a diluted etch solution inside of the via 205 throughout the entire fabrication process. As such, the etching amount on the redistribution metal layer 208 formed inside of the via 205 may be significantly limited and a desired thickness of the redistribution metal layer 208 in the via 205 may be obtained.

The method for holding the glass board 204 by the clamping unit may be a mechanical clamping method or a vacuum-suction holding method. The diluting agent (DI-water) may be sprayed out from a nozzle. When the dilution agent (DI-water) is sprayed, the nozzle may also rotate to ensure more efficient coverage of the diluting agent (DI-water) on the entire second surface of the semiconductor substrate 200.

During the pre-wetting process 21, the spin speed of the semiconductor substrate 200 may not be too fast, otherwise the diluting agent (DI-water) that has already been trapped in the via 205 may be easily spun-out, or the sprayed diluting agent (DI-water) may be immediately spun-out before even making contact with the via 205. Therefore, the amount of diluting agent (DI-water) retained in the via 205 after the pre-wetting process 21 may be relatively small. The spin speed of the semiconductor substrate 200 may not be too slow either, otherwise the diluting agent (DI-water) trapped in the via 205 may be flow out from the via 205 under the effect of gravity and, thus, the amount of the diluting agent (DI-water) retained in the via 205 may be relatively small.

In the meantime, with a slow spin speed of the semiconductor substrate 200, diluting agent (DI-water) residue may be still present on the second surface of the semiconductor substrate 200 after the pre-wetting process 21. As a result, during a subsequent chemical etching process, the etch solution may not be dense enough to efficiently remove the portion of the seed layer 206 formed on the second surface of the semiconductor substrate 200 on both sides of the redistribution metal layer 208.

Further, the pre-wetting time may not be too short, otherwise the amount of the diluting agent (DI-water) retained in the via 205 may be significantly limited. The pre-wetting time may not be too long either, otherwise unnecessary processing time may incur and, thus, may increase product cost.

In one embodiment, during the pre-wetting process 21, the spin speed of the semiconductor substrate 200 may be in a range of 250 rpm to 350 rpm; the pre-wetting time may be in a range of 1 min to 2 min; and the environmental temperature may be in a range of 22° C. to 24° C. Under the above processing conditions, the via 205 may retain sufficient DI-water after the pre-wetting process 21. In the meantime, presence of DI-water residue on the second surface of the semiconductor substrate 200 may also be prevented.

In certain other embodiments, during the pre-wetting process 21 and the subsequent chemical etching process, the opening of the semiconductor substrate may face upwards.

In one embodiment, because the pre-wetting process 21 and the chemical etching process may be alternately performed for multiple times, the pre-wetting process 21 described above may be the first pre-wetting process. In addition, after the completion of each pre-wetting process 21, spraying the diluting agent may be stopped.

Figure 13:
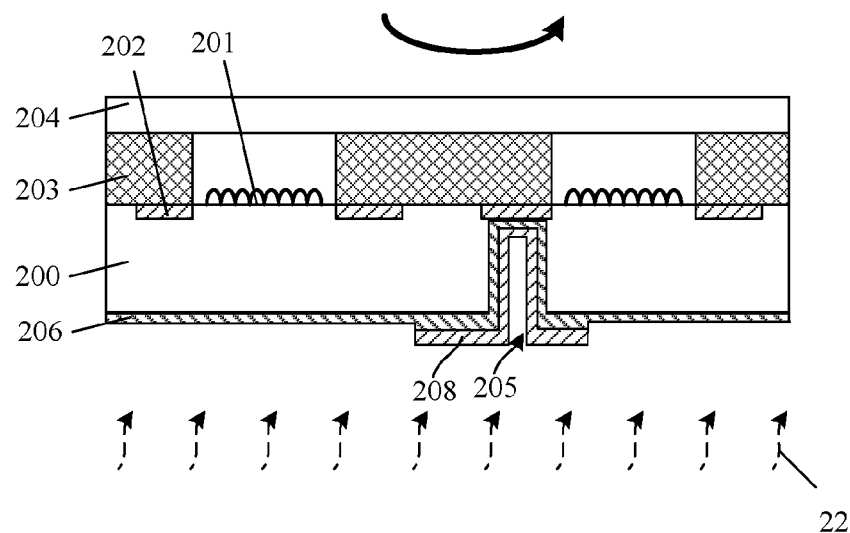
Figure 14:
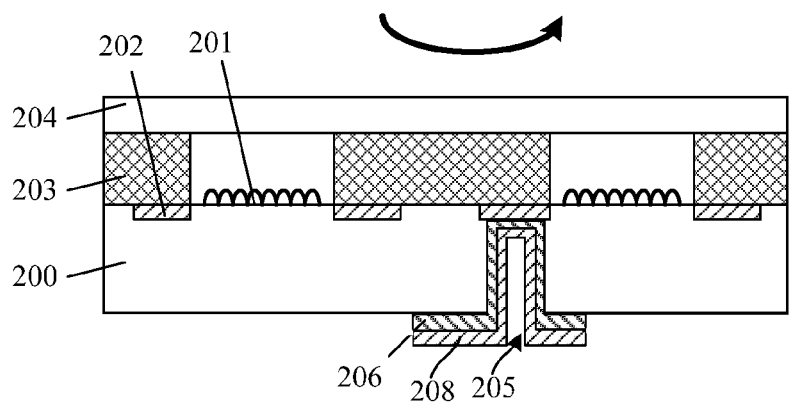

Returning to FIG. 16, a chemical etching process may be performed (S206). FIG. 13 shows a schematic diagram of the chemical etching process.

Referring to FIG. 13, after performing the pre-wetting process 21 (referring to FIG. 12), a chemical etching process 22 may be performed. Specifically, during the chemical etching process 22, an etch solution may be sprayed onto the surfaces of the seed layer 206 and the redistribution metal layer 208 to etch and remove a portion of the seed layer 206 not covered by the redistribution metal layer 208.

During the chemical etching process 22, a portion of the etch solution may enter the via 205 and may then be diluted by the diluting agent retained inside the via 205. Therefore, the etching on the redistribution metal layer 208 formed in the via 205 may be reduced while the etching on the seed layer formed on the second surface of the semiconductor substrate 200 may still be normal. In one embodiment, the etch solution entering the via 205 is diluted by DI-water retained in the via 205.

The chemical etching process 22 and the pre-wetting process 21 may be performed in a same etching chamber. During the chemical etching process 22, the opening of the via 205 formed in the semiconductor substrate 200 may remain downward-facing while the semiconductor substrate 200 may also remain spinning.

During the chemical etching process 22, the etch solution may be sprayed onto the second surface of the semiconductor substrate 200 using a nozzle. The nozzle may rotate when the etch solution is sprayed.

The time of the chemical etching process 22 may not be too long, otherwise the concentration of the diluted etch solution in the via 205 may increase so that etching on the redistribution metal layer 208 may occur. The time of the chemical etching process 22 may not be too short either, otherwise the removed thickness of the seed layer 206 may be relatively small and the etching efficiency may also be relatively low.

The spin speed of the semiconductor substrate 200 during the chemical etching process 22 may not be very different from the spin speed of the semiconductor substrate 200 during the pre-wetting process 21. When the spin speed of the semiconductor substrate 200 substantially increases or decreases as the fabrication process goes from pre-wetting to chemical etching, the amount of the diluting agent (DI-water) retained in the via 205 may be substantially changed.

In one embodiment, during the chemical etching process 22, the spin speed of the semiconductor substrate 200 may be in a range of 250 rpm to 350 rpm; the etching time may be in a range of 30 s to 50 s; and the environmental temperature may be in a range of 22° C. 24° C. Under the above processing conditions, the etching efficiency may be improved as a portion of the seed layer 206 is removed and, in the meantime, the redistribution metal layer 208 in the via may only be slightly etched.

In certain other embodiments, after finishing each chemical etching process 22, the spin speed of the semiconductor substrate 200 may be reduced (with respect to the spin speed during the chemical etching process 22) to let the diluted etch solution in the via flow out. During a subsequently-performed pre-wetting process 21, fresh diluting agent may be retained in the via 205 to prevent the diluted etch solution in the via from becoming dense again.

In one embodiment, the etch solution used in the chemical etching process 22 may include a sulfuric acid based etching fluid and a hydrofluoric acid solution. The sulfuric acid based etching fluid may be used to etch the seed layer in the seed layer 206 while the hydrofluoric acid solution may be used to etch the metal adhesive layer in the seed layer 206.

In certain other embodiments, the chemical etching process 22 may use any other appropriate etch solution. In addition, when the pre-wetting process 21 and the chemical etching process 22 need to be alternately performed for multiple times, the chemical etching process 22 described above may be the first chemical etching process. Further, after each chemical etching process is completed, spraying the etch solution may be stopped.

Returning to FIG. 16, further, the pre-wetting process and the chemical etching process may be alternately performed for multiple times until the portion of the seed layer not covered by the redistribution metal layer is completely removed (S207).

The pre-wetting process 21 and the chemical etching process 22 may be repeatedly performed for 4 to 10 times. In one embodiment, the pre-wetting process 21 and the chemical etching process 22 are alternately performed for 4 times. That is, the fabrication method includes consecutively performed a first pre-wetting process, a first chemical etching process, a second pre-wetting process, a second chemical etching process, a third pre-wetting process, a third chemical etching process, a fourth pre-wetting process, and a fourth chemical etching process. Each pre-wetting process may be identical with or similar to the pre-wetting process 21 described above while each chemical etching process may also be identical with or similar to the chemical etching process 22 described above.

In one embodiment, after removing the portion of the seed layer 206 formed on the second surface of the semiconductor substrate 200 on both sides of the redistribution metal layer 208, the method may further include performing a cleaning process. Specifically, DI-water may be used in the cleaning process to clean the redistribution metal layer 208 and the second surface of the semiconductor substrate 200. After the completion of the cleaning process, a drying process by blowing nitrogen gas may be adopted to remove the water on the redistribution metal layer 208 and the second surface of the semiconductor substrate 200.

Figure 15:
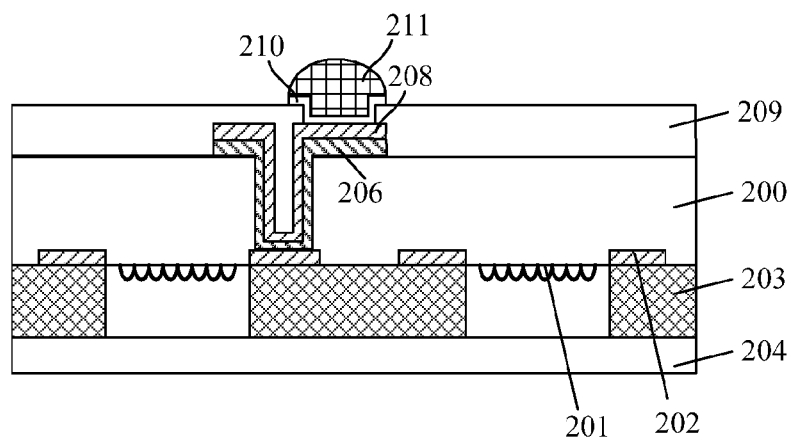

Returning to FIG. 16, after removing the portion of the seed layer formed on the second surface of the semiconductor substrate on both sides of the redistribution metal layer, an isolation material layer with an opening to expose a portion of the redistribution metal layer may be formed (S208). FIG. 15 shows a schematic cross-section view of a semiconductor structure consistent with disclosed embodiments.

Referring to FIG. 15, an isolation material layer 209 may be formed to fill the via 205 and cover the redistribution metal layer 208. An opening may then be formed in the isolation material layer 209 to expose a portion of the redistribution metal layer 208 formed on the second surface of the semiconductor substrate 200.

The isolation material layer 209 may be made of $SiO_x$, $SiN_x$, or any other appropriate isolation material. In one embodiment, the isolation material layer 209 is made of $SiO_x$. The opening in the isolation material layer is formed by photolithography and an etching process.

Further, returning to FIG. 16, a bulging lower metal layer and a metal bump may be formed to fill the opening in the isolation material layer (S209). FIG. 15 shows a schematic cross-section view of a semiconductor structure consistent with disclosed embodiments.

Referring to FIG. 15, a bulging lower metal layer 210 may be formed in the opening and also on a portion of the surface of the isolation material layer 209 on both sides of the opening. Further, a metal bump 211 may be formed on the bulging lower metal layer 210.

Specifically, the bulging lower metal layer 210 may be formed in the opening and on the surface of the isolation material layer 209 by a sputtering process. Then, a mask layer (not shown) may be formed on the bulging lower metal layer 210. A second opening (not shown) may be formed in the mask layer to expose the opening formed in the isolation material layer 209 and a portion of the bulging lower metal layer 210 on both sides of the opening. Further, the metal bump 211 may be formed in the second opening by an electroplating process. The mask layer may then be removed. Finally, a portion of the bulging lower metal layer 210 formed on the surface of isolation material layer 209 may be removed by an etching process using the metal bump 211 as an etch mask.

The metal bump 211 may be a soldering ball. The metal bump 211 may be initially formed by an electroplating process. After removing the portion of the bulging lower metal layer 210 formed on the surface of the isolation material layer 209 on both sides of the metal bump 211, a back-flow process may be performed on the metal bump 211 to form a curved surface for the metal bump 211.

In certain other embodiments, the metal bump may include a metal pillar and a soldering ball formed on the metal pillar. Correspondingly, after forming the mask layer with the second opening to expose the opening formed in the isolation metal layer as well as the portion of the surface of the bulging lower metal layer on both sides of the opening, the fabrication process for the metal bump may include forming a metal pillar in the second opening and then forming a soldering material layer on the metal pillar through an electroplating process. After removing the portion of the bulging lower metal layer formed on the surface of both sides of the isolation material layer, a back-flow process may be performed on the soldering material layer to form a curved surface for the soldering material layer.

The metal pillar may be made of one or more of Al, Ni, Sn, W, Pt, Cu, Ti, Cr, Ta, Au, Ag, etc. The soldering ball or the soldering material layer may be made of one or more of Sn, SnAg, SnPb, SnAgCu, SnAgZn, SnZn, SnBiIn, SnIn, SnAu, SnCu, SnZnIn, SnAgSb, etc.

The present disclosure also provides a semiconductor structure. The semiconductor structure may include a semiconductor substrate with a first surface and a second surface opposite to the first surface. At least one soldering pad may be formed on the first surface of the semiconductor substrate. The semiconductor structure may also include a via formed by etching the semiconductor substrate from the second surface of the semiconductor substrate to expose a surface of a soldering pad, a seed layer covering the sidewall and the bottom surfaces of the via and a portion of the second surface of the semiconductor substrate surrounding the via, and a redistribution metal layer formed on the seed layer by electroplating.

Specifically, the thickness of the redistribution metal layer formed on the second surface of the semiconductor substrate may be larger than the thickness of the redistribution metal layer formed in the via. The semiconductor structure may further include an isolation material layer formed to cover the second surface of the semiconductor substrate and the surface of the redistribution metal layer. An opening formed in the isolation material layer may expose a portion of the redistribution metal layer. Finally, the semiconductor structure may further include a bulging lower metal layer formed in the opening and a metal bump formed on the bulging lower metal layer.

Compared to existing methods and existing semiconductor structures, the semiconductor structure and the fabrication method described in the present disclosure may demonstrate several advantages.

According to the fabrication method of the present disclosure, the redistribution metal layer may be formed on the surface of the seed layer inside of the opening formed in the mask layer by an electroplating process. Then, a pre-wetting process may be performed. Specifically, a diluting agent (such as DI-water) may be sprayed onto the surfaces of the seed layer and the redistribution metal layer so that a portion of the diluting agent (DI-water) may be retained in the via.

After the completion of the pre-wetting process, a chemical etching process may be performed. During the chemical etching process, an etch solution may be sprayed onto the surface of the seed layer and the surface of the redistribution metal layer to etch a portion of the seed layer formed on the second surface of the semiconductor substrate on both sides of the redistribution metal layer. The pre-wetting process and the chemical etching process may be alternately performed for multiple times until the portion of the seed layer not covered by the redistribution metal layer is completely removed.

During the pre-wetting process, a portion of the diluting agent (DI-water) may be retained in the via. Because of the presence of the portion of the diluting agent (DI-water) in the via, when performing the subsequent chemical etching process, the chemical etch solution in the via may be diluted. Therefore, the etching effect of the diluted chemical etch solution on the redistribution metal layer formed in the via may be relatively limited. As a very small amount of the redistribution metal layer is etched, etching through the redistribution metal layer in the via may be prevented.

Further, during the pre-wetting process, the clamping unit in the etching apparatus may hold the glass board with the opening formed in the semiconductor substrate facing downwards. The clamping unit may then be driven to let the semiconductor substrate spin. In the meantime, a diluting agent (DI-water) may be sprayed onto the surfaces of the seed layer and the redistribution metal layer from down to up. The diluting agent (DI-water) sprayed on the surface of the seed layer formed on the second surface of the semiconductor substrate may be spun-out under the effect of centrifugal force and gravity. Therefore, presence of diluting agent (DI-water) residue on the second surface of the semiconductor substrate may be avoided and, thus, a subsequently-performed chemical etching process may not be affected. Moreover, the portion of the diluting agent (DI-water) sprayed into the via may be held in the via because the sidewall of the via may provide support to the diluting agent (DI-water) to cancel the effect of centrifugal force.

Further, when the diluting agent is DI-water, during the pre-wetting process, the spin speed of the semiconductor substrate may be in a range of 250 rpm to 350 rpm; the pre-wetting time may be in a range of 1 min to 2 min; and the environmental temperature may be in a range of 22° C. to 24° C. Under such processing conditions, the via may retain sufficient DI-water after the pre-wetting process and, in the meantime, DI-water residue on the second surface of the semiconductor substrate may also be prevented.

Further, during the chemical etching process, the spin speed of the semiconductor substrate may be in a range of 250 rpm to 350 rpm; the etching time may be in a range of 30 s to 50 s; and the environment temperature may be in a range of 22° C. to 24° C. Under the above processing conditions, the etching efficiency may be improved as a portion of the seed layer is removed and, in the meantime, the redistribution metal layer in the via may only be slightly etched.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:

provide a semiconductor substrate with a first surface and a second surface opposite to the first surface, wherein at least one soldering pad is formed on the first surface of the semiconductor substrate;

forming at least one via in the semiconductor substrate to expose each soldering pad by etching the semiconductor substrate from the second surface of the semiconductor substrate;

forming a seed layer to cover a sidewall surface and a bottom surface of each via and the second surface of the semiconductor substrate;

forming a redistribution metal layer to cover a portion of the seed layer formed on the sidewall and the bottom surfaces of each via and on a portion of the second surface of the semiconductor substrate surrounding each via;

performing a pre-wetting process by spraying a diluting agent onto the seed layer and the redistribution metal layer to let each via retain a portion of the diluting agent;

performing a chemical etching process right after the pre-wetting process by spraying an etch solution onto the seed layer and the redistribution metal layer to remove a portion of the seed layer not covered by the redistribution metal layer; and repeating the pre-wetting process and the chemical etching process alternately until the portion of the seed layer not covered by the redistribution metal layer is completely removed.

2. The method for fabricating the semiconductor structure according to claim 1, wherein forming the redistribution metal layer further includes:

forming a mask layer on the seed layer with an opening to expose a portion of the seed layer formed on the sidewall and the bottom surfaces of each via and a portion of the surface of the seed layer surrounding each via;

performing an electroplating process to form the redistribution metal layer covering the portion of seed layer exposed by the opening of the mask layer; and removing the mask layer.

3. The method for fabricating the semiconductor structure according to claim 1, wherein:

a plurality of device components including photosensitive areas, MEMS transistors, and integrated circuits are formed on the first surface of the semiconductor substrate;

the plurality of device components are electrically connected to corresponding soldering pads of the at least one soldering pad formed on the first surface of the semiconductor substrate.

4. The method for fabricating the semiconductor structure according to claim 3, wherein:

a plurality of photosensitive areas are formed on the first surface of the semiconductor substrate;

the at least one soldering pad is formed on the first surface of the semiconductor substrate surrounding each photosensitive area;

a plurality of embankment structures are formed on the first surface of the semiconductor substrate to surround the plurality of photosensitive areas;

a plurality of cavities are formed by the plurality of embankment structures, wherein each cavity exposes a corresponding photosensitive area; and a glass board is placed on the plurality of embankment structures to seal openings of the cavities formed in the embankment structures.

5. The method for fabricating the semiconductor structure according to claim 4, wherein performing the pre-wetting process and the chemical etching process further includes:

holding the glass board by using a clamping unit in an etching apparatus with an opening of each via formed in the semiconductor substrate facing downwards; and driving the clamping unit to let the semiconductor substrate spin.

6. The method for fabricating the semiconductor structure according to claim 5, wherein:

the diluting agent used in the pre-wetting process is deionized water (DI-water) or organic solvent; and the diluting agent is sprayed onto the surfaces of the seed layer and the redistribution metal layer from down to up.

7. The method for fabricating the semiconductor structure according to claim 6, wherein, during the pre-wetting process:

the diluting agent used in the pre-wetting process is DI-water;

a spin speed of the semiconductor substrate is in a range of 250 rpm to 350 rpm;

a pre-wetting time is in a range of 1 min to 2 min; and an environmental temperature is in a range of 22° C. to 24° C.

8. The method for fabricating the semiconductor structure according to claim 5, wherein, during the chemical etching process, the etch solution is sprayed onto the surfaces of the seed layer and the redistribution metal layer from down to up;

a spin speed of the semiconductor substrate is in a range of 250 rpm to 350 rpm;

an etching time is in a range of 30 s to 50 s; and an environmental temperature is in a range of 22° C. to 24° C.

9. The method for fabricating the semiconductor structure according to claim 5, wherein the pre-wetting process and the chemical etching process are alternately performed for 4 to 10 times.

10. The method for fabricating the semiconductor structure according to claim 5, wherein a spin speed of the semiconductor substrate during the pre-wetting process is the same as a spin speed of the semiconductor substrate during the chemical etching process.

11. The method for fabricating the semiconductor structure according to claim 1, wherein the seed layer has a double-layer structure including a metal adhesion layer and a seed layer formed on the metal adhesion layer.

12. The method for fabricating the semiconductor structure according to claim 11, wherein a thickness of the seed layer formed on the semiconductor substrate is larger than a thickness of the seed layer formed on the sidewall and the bottom surfaces of the via.

13. The method for fabricating the semiconductor structure according to claim 11, wherein the metal adhesion layer and the seed layer is formed by sputtering.

14. The method for fabricating the semiconductor structure according to claim 1, wherein the redistribution metal layer is made of Cu.

15. The method for fabricating the semiconductor structure according to claim 1, wherein a thickness of the redistribution metal layer formed on the second surface of the semiconductor substrate is larger than a thickness of the redistribution metal layer formed in the via.

16. The method for fabricating the semiconductor structure according to claim 1, after completely removing the portion of the seed layer not covered by the redistribution metal layer, further including:
   cleaning the surface of the redistribution metal layer and the second surface of the semiconductor substrate through a cleaning process using DI-water; and
   removing water residue on the redistribution metal layer and the second surface of the semiconductor substrate through a drying process using nitrogen gas.

17. The method for fabricating the semiconductor structure according to claim 1, after completely removing the portion of the seed layer not covered by the redistribution metal layer, further including:
   forming an isolation material layer to cover the redistribution metal layer and fill the via;
   forming an opening in the isolation material layer to expose a portion of the redistribution metal layer on the second surface of the semiconductor substrate;
   forming a bulging lower metal layer on the surface of the portion of the redistribution metal layer exposed in the opening; and
   forming a metal bump on the bulging lower metal layer.

* * * * *